United States Patent [19]
Goldman et al.

[11] Patent Number: 5,592,366
[45] Date of Patent: Jan. 7, 1997

[54] FRONT LOADING COMPUTER/BUS EXTENDER

[76] Inventors: Jacob Goldman, 18242 W. McDurmott St., Irvine, Calif. 92714; Moshe Zarmi, New York, N.Y.

[21] Appl. No.: 314,857

[22] Filed: Sep. 29, 1994

[51] Int. Cl.$^6$ .................................................. H05K 7/14
[52] U.S. Cl. ...................... 361/796; 361/797; 361/802; 361/756; 361/694
[58] Field of Search ............................. 361/796, 694, 361/754, 752, 756, 799, 797, 802; 174/17 R; 206/334, 328; 248/27.1, 27.3; 211/41

[56] References Cited

U.S. PATENT DOCUMENTS

| | | |
|---|---|---|
| 4,680,674 | 7/1987 | Moore . |
| 4,754,397 | 7/1988 | Varaiya et al. . |
| 4,787,029 | 11/1988 | Khan . |
| 4,853,850 | 8/1989 | Krass, Jr. et al. . |
| 4,903,230 | 2/1990 | Kaplan et al. . |
| 4,967,311 | 10/1990 | Ferchau et al. . |
| 5,051,868 | 9/1991 | Leverault et al. ...................... 361/395 |
| 5,168,424 | 12/1992 | Bolton et al. . |
| 5,172,305 | 12/1992 | DeWilde . |
| 5,175,536 | 12/1992 | Aschliman . |
| 5,247,427 | 9/1993 | Driscoll et al. . |
| 5,331,509 | 7/1994 | Kikinis . |
| 5,339,221 | 8/1994 | Conroy-Wass et al. . |

FOREIGN PATENT DOCUMENTS

| | | | |
|---|---|---|---|
| 2663810 | 11/1992 | France ..................................... | 361/754 |
| 4065192 | 3/1992 | Japan ..................................... | 361/694 |

OTHER PUBLICATIONS

"The Siemens Microcomputer Module System SMP80", by Irmfried Bromme, Components Report, XII (1977) No. 5, pp. 181–184.

*Primary Examiner*—Leo P. Picard
*Assistant Examiner*—Y. Whang
*Attorney, Agent, or Firm*—Cobrin Gittes & Samuel

[57] ABSTRACT

An instrument chassis is disclosed. The chassis includes a housing with a front opening in a first loading plane, and instrument receiving slots located in the housing. These slots are engageable to printed circuit cards inserted through the front opening. The chassis also includes first and second power supplies. The first power supply is electrically coupled to a first set of instrument receiving slots, and the second power supply is electrically coupled to a second set of the instrument receiving slots. Thus a first set of the printed circuit cards may maintain electrical and mechanical separation and isolation from a second set of the printed circuit cards.

6 Claims, 9 Drawing Sheets

FRONT LOADING COMPUTER/BUS EXTENDER

BACKGROUND OF THE INVENTION

This invention relates generally to computer systems for industrial experimentation and more particularly to a front loading computer instrument chassis that can be used as a stand-alone computer or bus extender.

Presently there exist front loading computers and bus extender computers; however these computers and bus extenders suffer from a number of problems that are solved by the present invention. Examples of such devices are set forth in the following patents and articles:

| U.S. Pat. No. | Inventor |
| --- | --- |
| 4,680,674 | Moore |
| 4,754,397 | Varaiya et al. |
| 4,787,029 | Khan |
| 4,853,850 | Krass, Jr. et al. |
| 4,903,230 | Kaplan et al. |
| 4,967,311 | Ferchau et al. |
| 5,168,424 | Bolton et al. |
| 5,172,305 | DeWilde |
| 5,175,536 | Aschliman |
| 5,247,427 | Driscoll et al. |
| 5,331,509 | Kikinis |
| 5,339,221 | Conroy-Wass et al. |

"The Siemens Microcomputer Module System SMP80", by Irmfried

Bromine, Components Report, XII (1977) No. 5, pages 818–184.

U.S. Pat. No. 4,680,674 to Moore discloses a Modular Computer System with Integral Electronic Bus.

U.S. Pat. No. 4,754,397 to Varaiya et al. discloses Fault Tolerant Modular Subsystems for Computers.

U.S. Pat. No. 4,787,029 to Khan discloses a Level Converting Bus Extender with Subsystem Selection Signal Decoding Enabling Connection to Microprocessor.

U.S. Pat. No. 4,853,850 to Krass, Jr. et al. discloses a Vehicle Computer Diagnostic Interface Apparatus.

U.S. Pat. No. 4,903,230 to Kaplan et al. discloses a Remote Terminal Address and Baud Rate Selection.

U.S. Pat. No. 4,967,311 to Ferchau et al. discloses an Electronic Module Interconnection System.

U.S. Pat. No. 5,168,424 to Bolton et al. discloses a Multi Unit Electrical Apparatus with Dual Inlet Fans Positioned Opposite Unit Bays.

U.S. Pat. No. 5,172,305 to De Wilde discloses a Circuit Board Enclosure with Displaceable Power Supply.

U.S. Pat. No. 5,175,536 to Aschliman discloses an Apparatus and Method for Adapting Cards Designated for VME Bus for use in a VXI Bus system.

U.S. Pat. No. 5,247,427 to Driscoll et al. discloses a Disk Array Subsystem having Elongated T-shaped Guides for use in a Data Processing System.

U.S. Pat. No. 5,331,509 to Kikinis discloses a Modular Notebook Computer Having a Planar Array of Module Bays and a Pivotally Attached Flat-Panel Display.

U.S. Pat. No. 5,339,221 to Conroy-Wass et al. discloses a Printed Circuit Board Mounting Cage.

Some of the problems that are faced by these devices are that they require an operator to utilize only cards configured for the particular device. In other words a top loading instrument card is not capable of being used with these front loading devices. Further, these devices can only be used in one capacity, either as a computer or as a bus extender but not both. They do not have proper cooling systems which can cause operational problems with the computer, and they are generally expensive. The cooling systems offered by ordinary PCs may be inadequate for a system requiring numerous instruments, and could cause power failures and degraded performance.

Thus there exists the need for a front loading computer instrument chassis that can be utilized as a stand-alone computer or a bus extender that has an improved cooling system, multiple power supplies, is inexpensive, and enables an operator to insert and remove PC instrument cards without powering down the entire computer.

It is accordingly an object of the invention to provide a front loading computer instrument chassis.

It is another object of the invention to provide a front loading computer instrument chassis that can be used as a stand-alone computer or as a bus extender.

It is a further object of the invention to provide a front loading computer instrument chassis that can be used as a stand-alone computer or as a bus extender that has an improved cooling system.

It is still another object of the present invention to provide a computer instrument chassis that can be used as a stand-alone computer or as a bus extender which has dual power supplies.

Yet another object of the present invention is to provide a computer instrument chassis that can be used as a stand-alone computer or as a bus extender that allows an operator to insert or remove PC instrument cards without powering down, removing casements or interrupting the CPU.

SUMMARY OF THE INVENTION

The foregoing objects are attained by the present invention, which provides a front loading computer instrument chassis which may be used as a stand-alone computer or a bus extender. The invention utilizes a housing having a front, the front having an opening in a first loading plane. The invention further utilizes instrument receiving slots (the terms slots and instrument receiving slots will hereinafter be used interchangeably) located in the housing. These slots are engageable to printed circuit cards inserted through the front opening of the housing. There are also first and second power supplies. The first power supply is electrically coupled to a first set of the instrument receiving slots. The second power supply is electrically coupled to a second set of the instrument receiving slots. Thus a first set of the printed circuit cards may be maintained in electrical and mechanical separation and isolation from a second set of said printed circuit cards.

In another embodiment of the invention, a carrier card which is adapted for use in a front loading computer instrument chassis that has a plurality of instrument receiving slots, is utilized. The carrier card includes a board having a front, a first face, and a bottom. A first set of connectors are attached to the front of the board such that the carrier card connects to the computer instrument chassis at the front of the board. The carrier card further includes a second set of connectors attached to the first face of the board proximal the bottom of the board such that a top loading PC instrument card is connectable to the carrier card in a relatively parallel position. The second set of connectors are coupled to the first set of connectors. They are configured such that when the top loading PC instrument card is connected to the carrier card the top loading PC instrument card is capable of interacting with the front loading computer instrument chassis. The carrier card also includes DIP (Dual In-line Package) switches connected to the carrier card. These DIP switches provide for an offset input/output address to be added to an address of the PC instrument card. The carrier card further includes an inter-card bus attached to the board having a plurality of bus lines whereby selected bus lines can be configured into several sub-buses serving selected cards.

The invention will next be described in connection with certain illustrated embodiments; however, it should be clear to those skilled in the art that various modifications, additions and subtractions can be made without departing from the spirit or scope of the claims.

BRIEF DESCRIPTION OF THE DRAWINGS

For a fuller understanding of the nature and objects of the invention, reference should be made to the following detailed description and accompanying drawings, in which.

DESCRIPTION OF THE EMBODIMENTS

Figure 1:
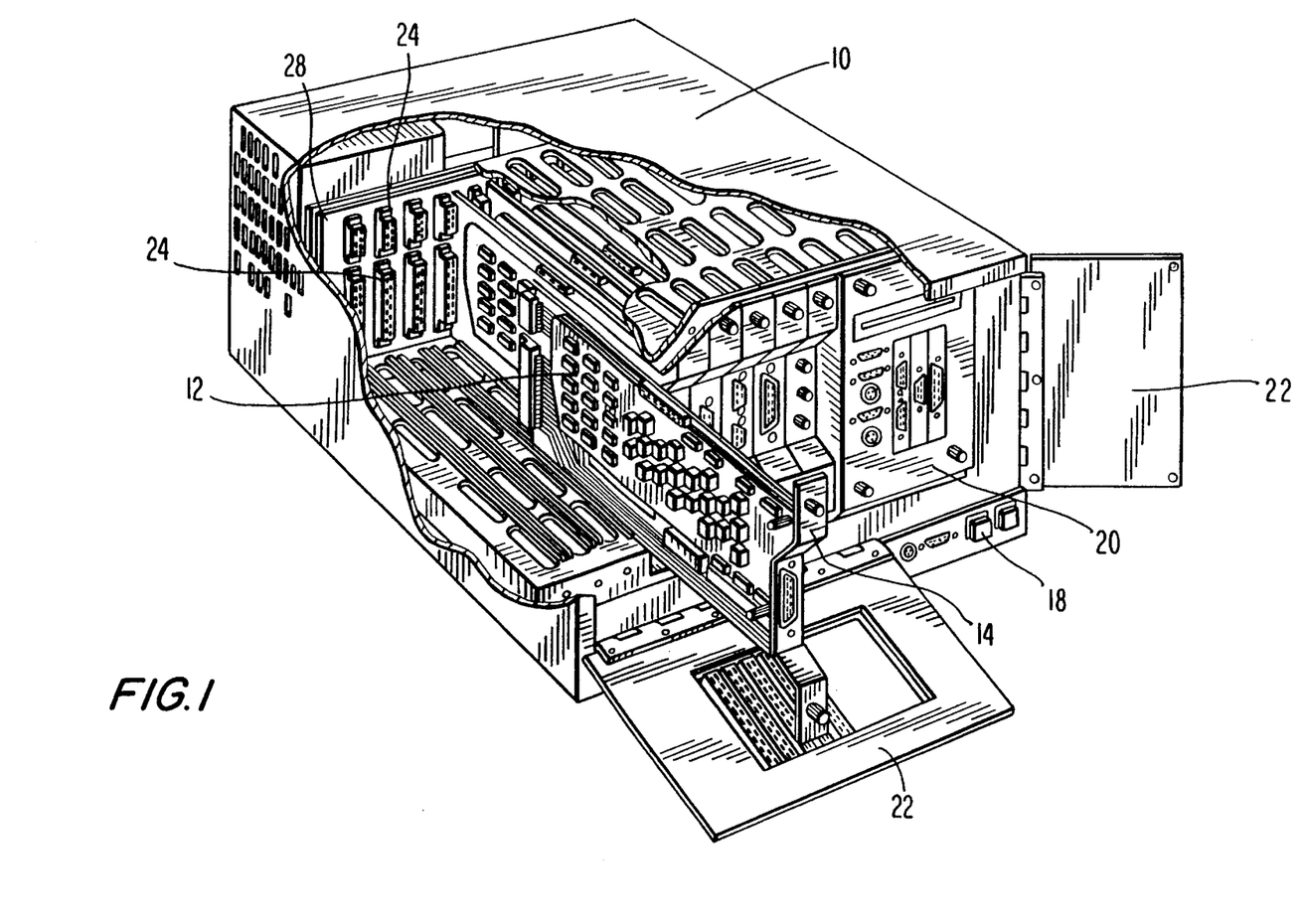
FIG. 1 depicts a perspective view of the invention configured as a stand-alone computer showing a housing, a carrier card, a CPU (central processing unit) module, other PC instrument cards loaded in various instrument receiving slots, multiple power switches, and front covers.

The overall configuration of the present invention is depicted in FIG. 1. The invention is directed to a computer instrument chassis. The computer instrument chassis is designed for testing, data acquisition, and process control applications or any other application requiring the use of PC-based instrumentation. The invention allows an operator to integrate PC instrument cards 12 of arbitrary configuration using a VXI-like front loading mechanism. In accordance with the invention PC instrument cards 12 are buffered and shielded from one another to prevent interference and cross-talk between instruments. The entire system is buffered, providing isolation between the CPU and the instruments and between the individual instruments as well.

The computer busses (address, data and control) are buffered on the CPU module 20, the bus expander unit 44, and the carrier cards 14. This isolation not only safeguards the CPU from any hazardous condition, it also prevents a single instrument from hanging-up" the bus and disabling the entire computer. The computer instrument chassis is front loading and may be used as a standalone computer or as a bus extender depending upon its configuration.

Figure 10:
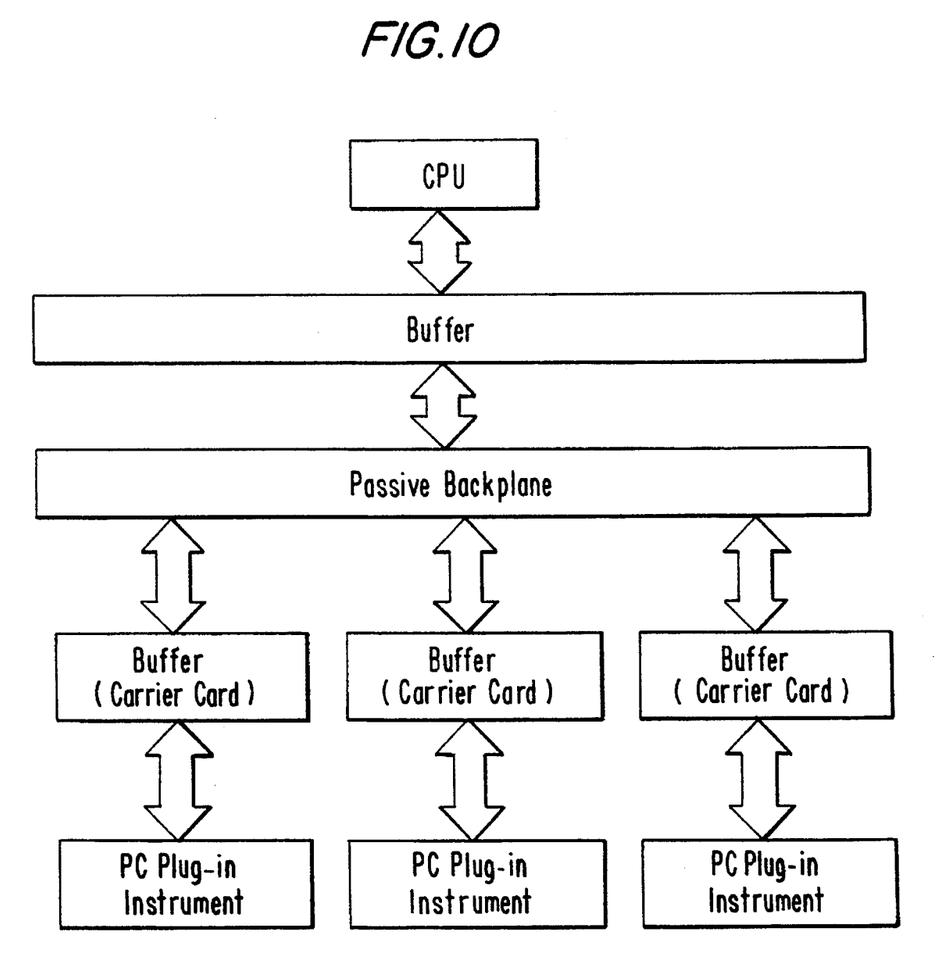
FIG. 10 depicts a flow chart showing the bus isolation between the PC instrument card and the CPU.

FIG. 1 depicts a perspective view of the invention configured as a stand-alone computer (stand-alone mode) showing a housing 10, a carrier card 14, a CPU module 20, other PC instrument cards 12 loaded in various instrument receiving slots 24, multiple power switches 18, and hinged front covers 22. The CPU module 20 occupies four slots 24 and may include a conventional CPU, floppy disk drives, hard disk drives, a VGA interface, two RS-232 ports, and a parallel port. It may also provide one open slot for special I/O (input/output) interface such as GPIB MXI/VXI or a bus expander for an additional computer instrument chassis. The CPU module 20 maintains electrical and mechanical separation from the I/O buses. This configuration of the first embodiment provides 10 available slots 24 for PC instrument cards 12 (as shown in FIG. 10). In the stand-alone mode, one power supply provides power to the CPU module 20 while the second power supply provides power to the PC instrument cards. Each of the two power supplies has its own power switch 18 allowing the PC instrument cards to be powered down while the computer is running. In a second configuration of the invention the computer instrument chassis can be configured as a bus expander.

Figure 11:
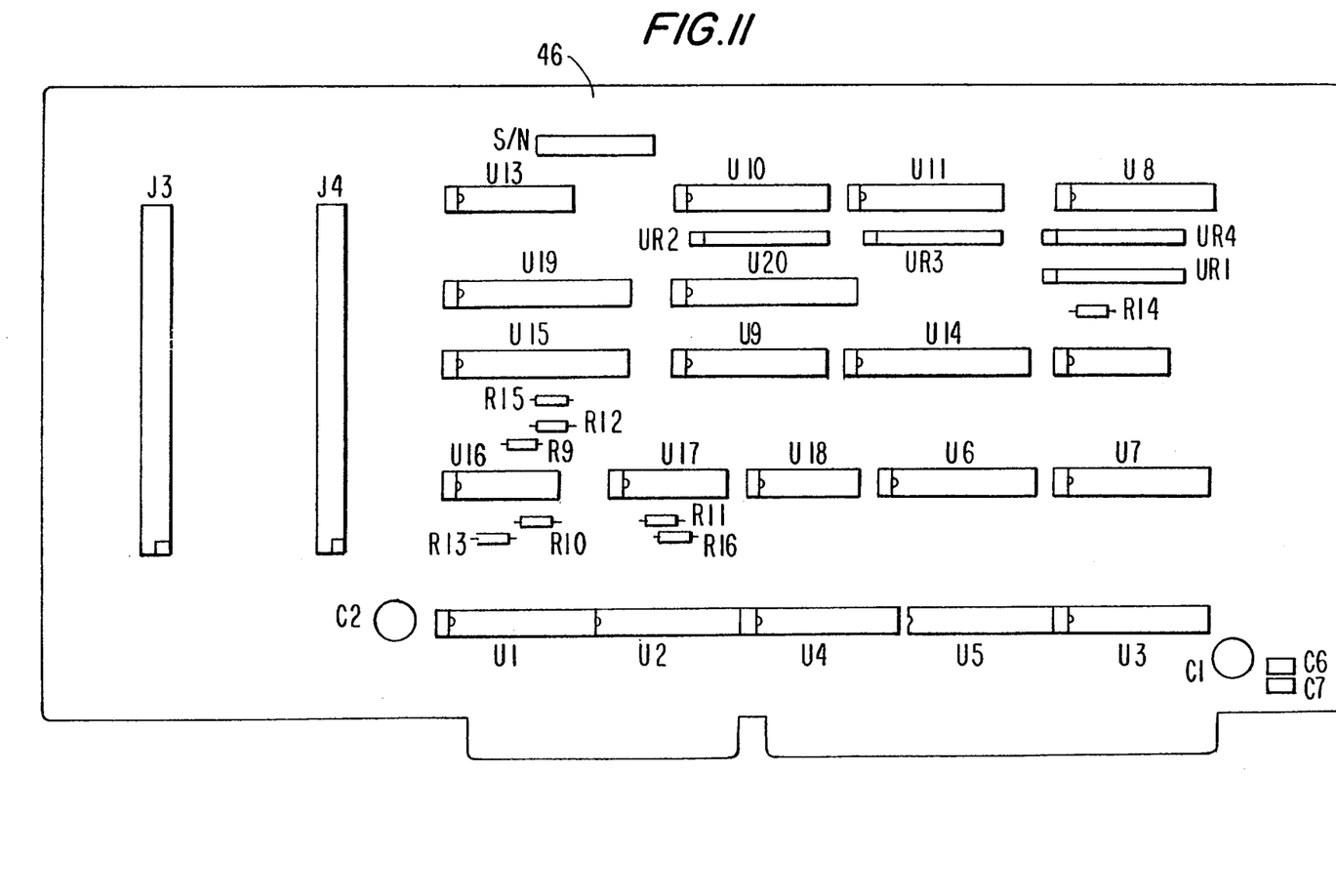
FIG. 11 depicts a bus expansion buffer card.

As a bus expander (expanded mode) it can accommodate up to 13 plug-in instruments. The invention will accept any IBM Personal Computer AT (or PC-compatible) computer as a controller. The PC bus is extended via a carrier card 14 designed to completely isolate the PC bus from the application environment. The computer busses (address, data and control) are isolated from the application hardware. Isolation not only safeguards the computer operation, it also enables the invention to offset PC instrument card addresses to any I/O address location. Thus I/O address space will not be limited by the PC system or I/O devices used when using the computer instrument chassis. It will be apparent to one skilled in the art that two computer instrument chassis may be daisy linked to accommodate up to twenty three PC instrument cards under a single CPU. In the expanded mode, the computer instrument cards 12 utilize a dedicated power supply and cooling system. For applications using cards with high current consumption, the operator can divide the application bay into two sections (slots 1–6 and 7–13 seen on FIG. 3) and use the additional power supply to support the higher slots (7–14). When the invention is configured in expanded mode one method of achieving this may be by utilizing a bus expander card 46 as depicted in FIG. 11.

The bus expander card can be thought of as a "transmitter" card and can be installed in the host computer in an available ISA slot. In accordance with the present invention this expander card is coupled to a second "receiver" card by a pair of 1 m shielded cables. The receiver card receives the bus signals from the bus expander card and routes them to the backplane of the present invention.

Figure 3:
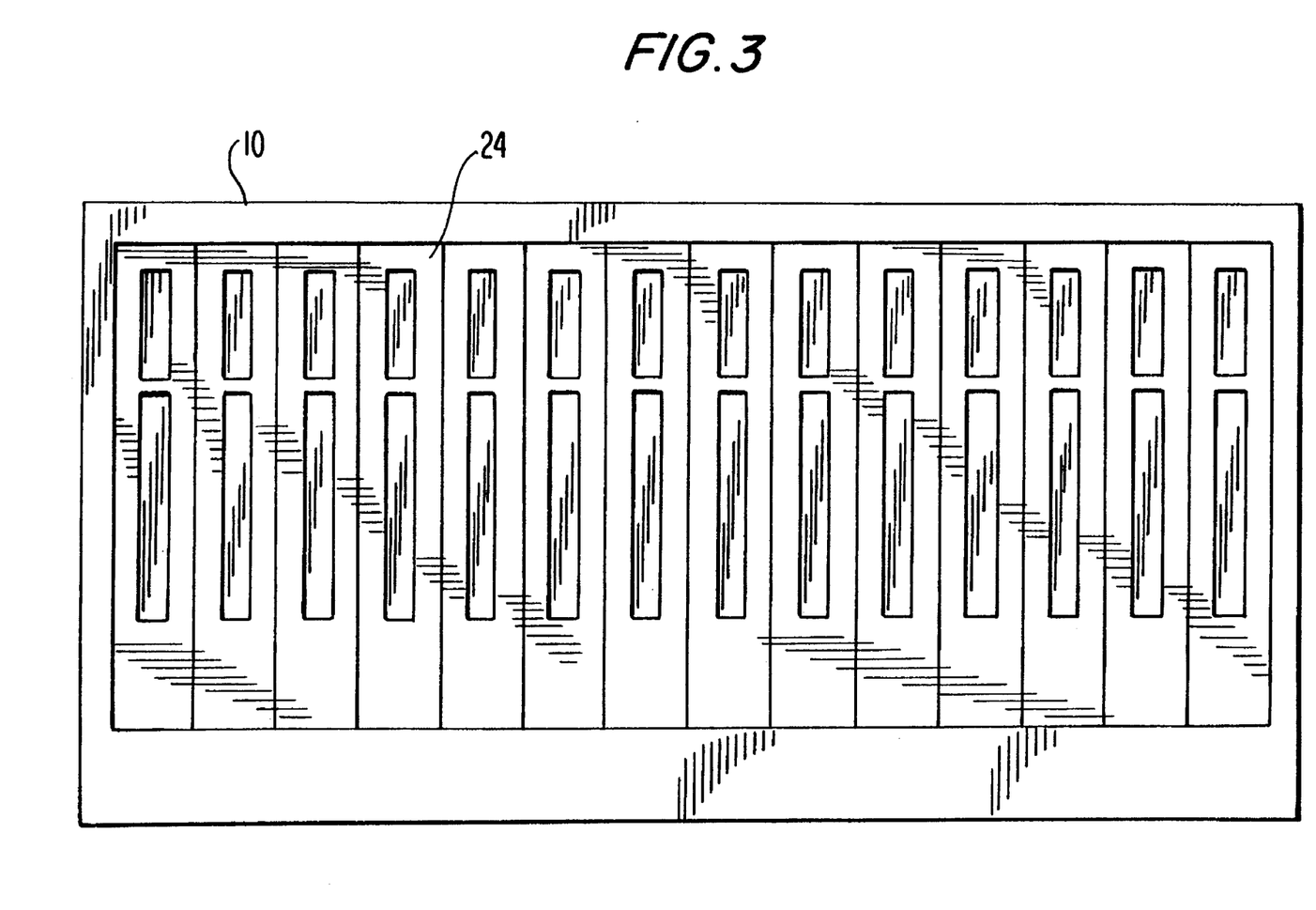
FIG. 3 depicts an arrangement for the plurality of instrument receiving slots.
Figure 4:
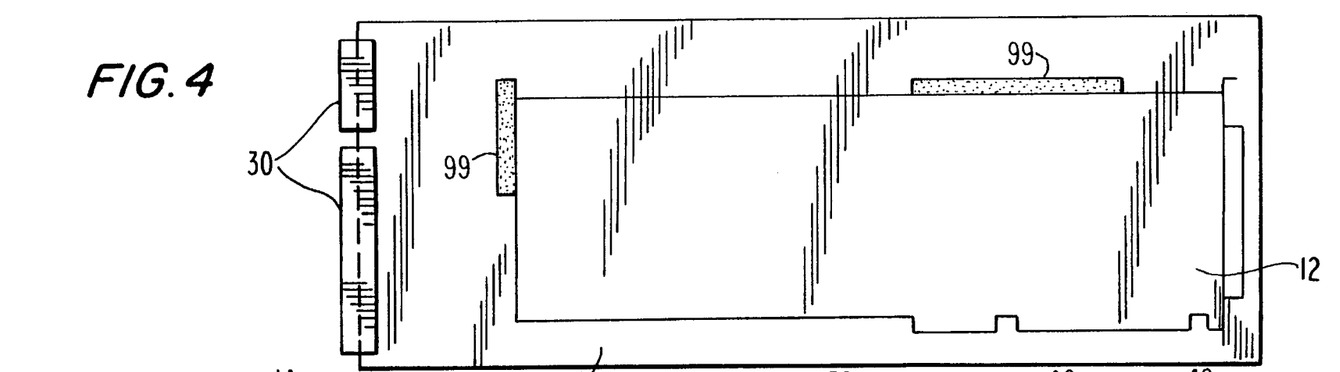
FIG. 4 depicts a carrier card with a PC instrument card mounted thereon.

In one embodiment of the invention shown in FIGS. 1 and 3 the computer instrument chassis may have 14 slots and two hinged front panels 22. The number of slots may be increased or decreased depending upon the design requirements. Four fans 16 provide efficient cooling for the entire computer instrument chassis. There may be more or fewer fans depending upon the number of slots that have been provided in the chassis.

Figure 2:
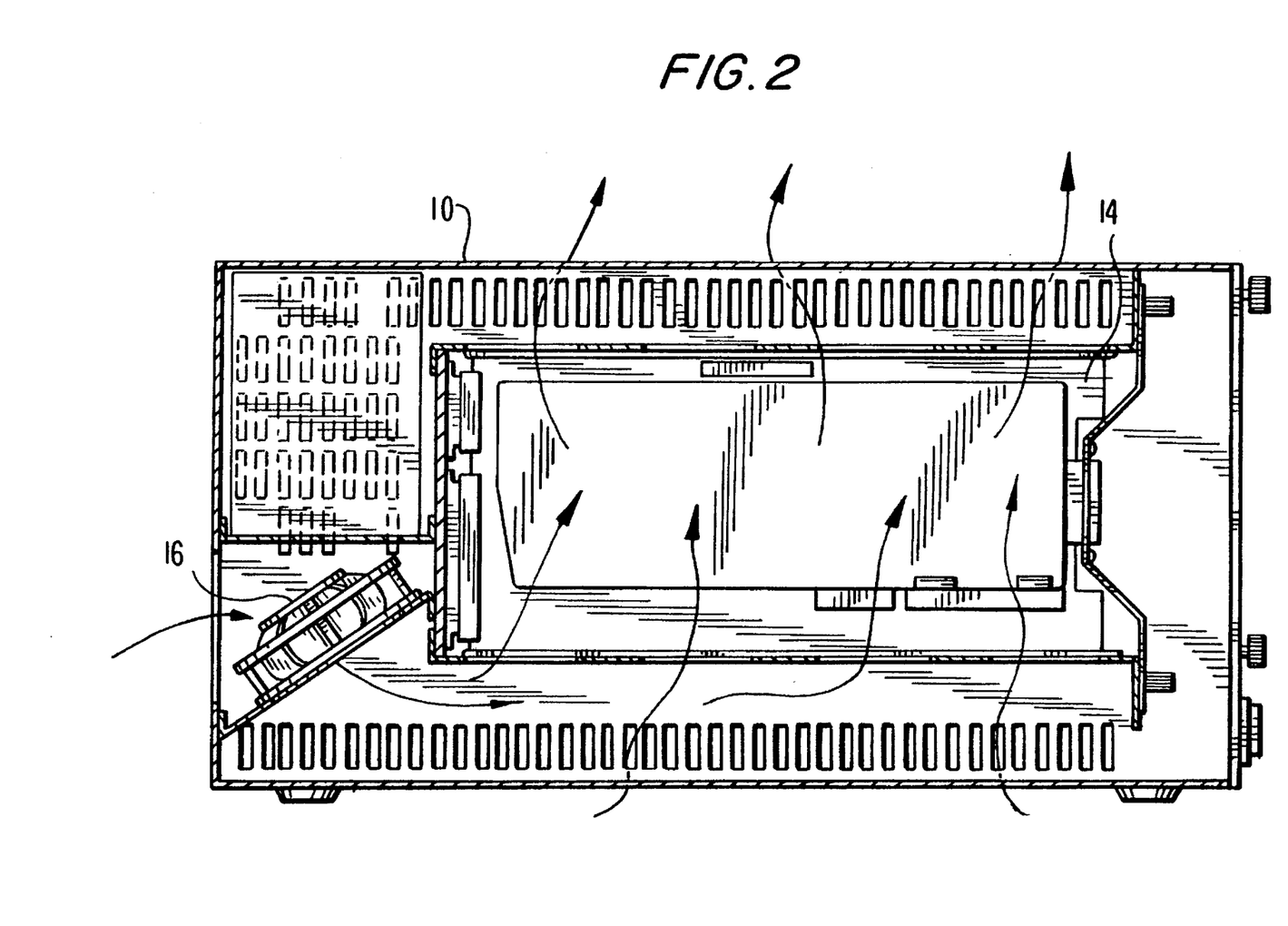
FIG. 2 depicts a cross-sectional side view of the invention showing placement of one of the plurality of fans and direction of air flow within the housing.

FIG. 2 depicts the embodiment of the invention showing placement of the plurality of fans 16 and direction of air flow within the housing 10 as a result of this placement. Each of the fans in this embodiment provides 56 CFM (cubic feet per minute). The number of fans provided can also be changed dependant upon the CFM provided by each fan. Two of the fans are used for power supplies cooling and two for the instrumentation. Additional fans directed towards specific instruments that require special cooling may also be provided.

In FIG. 1, the power switches 18 are shown. In this embodiment there are two power switches 18 that control two power supplies (not shown). In this embodiment there are two DC power supplies providing +5 VDC at 50 A (max), +12 VDC at 19 A (max), −5 VDC at 1 A (max), −12 VDC at 1 A (max).

FIGS. 4–8 depict the carrier card 14. The carrier card 14 allows the computer instrument chassis to physically and electrically accommodate any PC instrument card 12 having different configurations such as top loading. The carrier card 14 converts the top loading method of ordinary PCs into a front loading one similar to the ones found in VXI/VME systems. This front loading removes the need to open the computer to remove or insert PC instrument cards. This is an important advantage of the invention. When these card carriers 14 are loaded in the chassis, they are recessed behind the front panel 22 to allow room for internal wiring connection to the interface panel 28. The interface panel 28 can employ a variety of slots 24 such as Virginia Panel, ITT Cannon ZIF connectors, circular connectors and the like.

Figure 5:
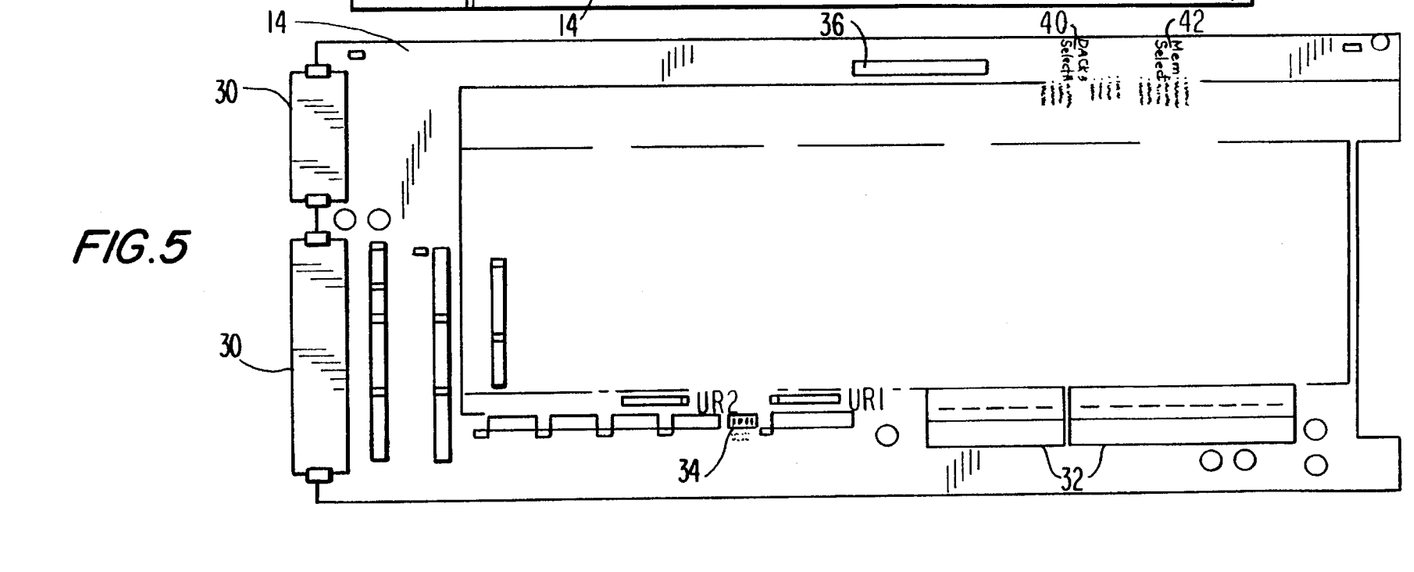
FIG. 5 depicts a schematic drawing of a carrier card showing a first set of connectors, a second set of connectors, DIP switches, and an inter-card bus.
Figure 5A:
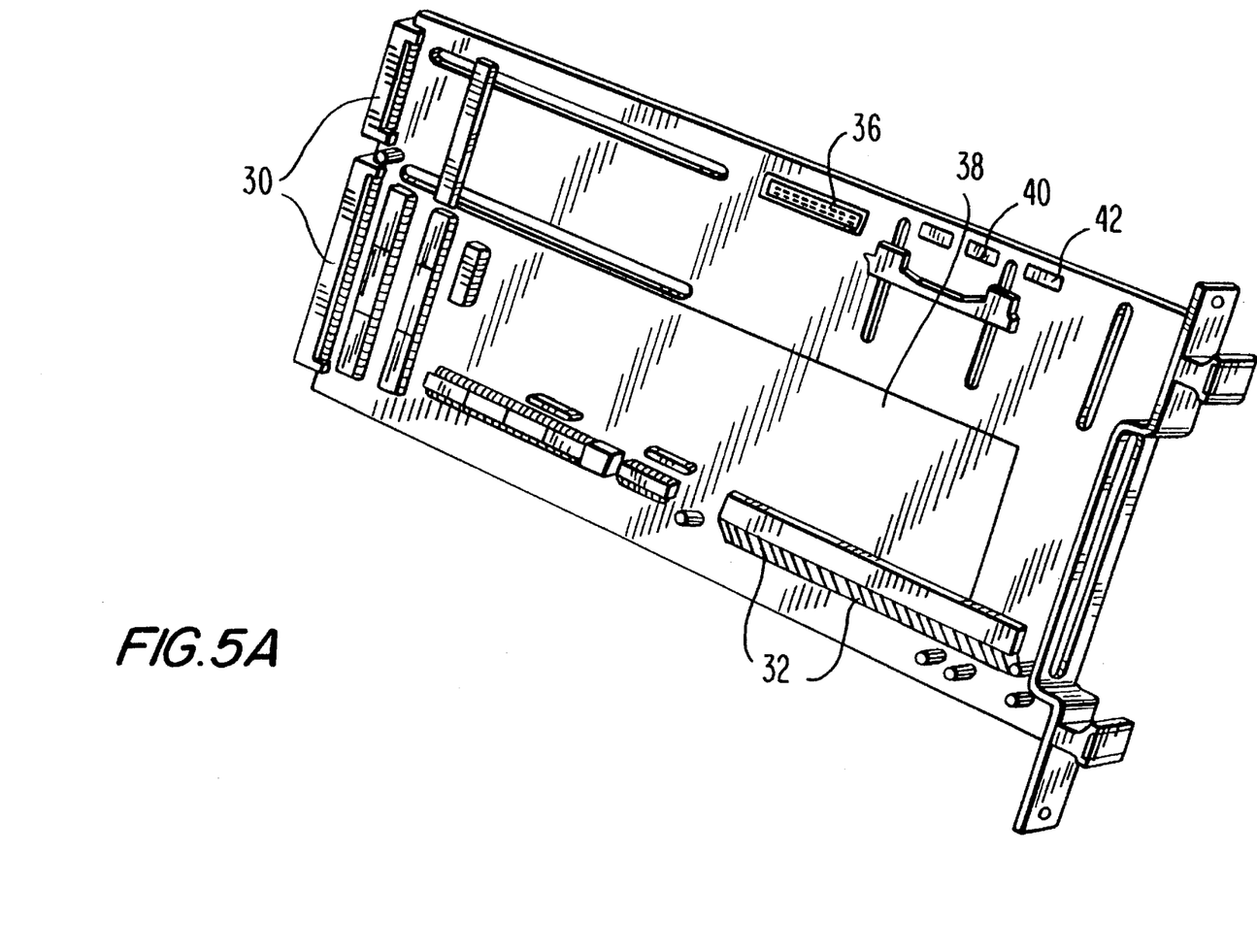
FIG. 5A depicts a carrier card showing the connections between the first set of connectors and the second set of connectors.
Figure 6:
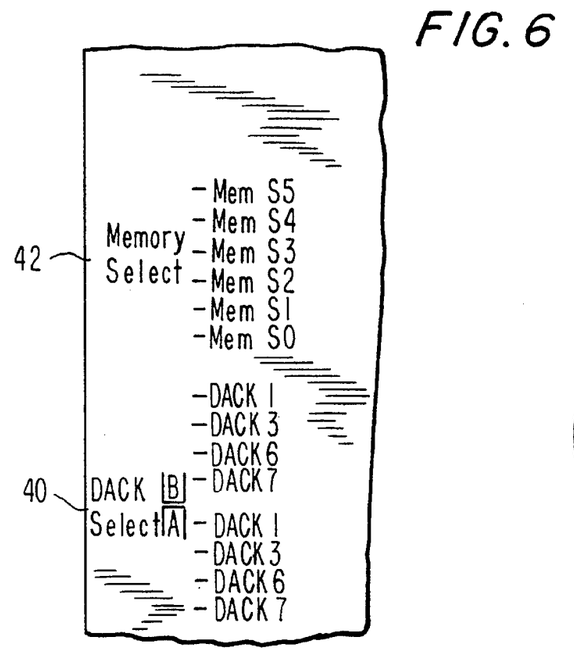
FIG. 6 depicts an exploded view of a section of a carrier card showing carrier card jumper settings.
Figure 7:
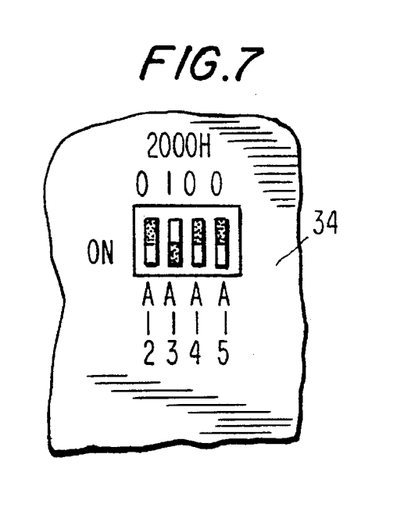
FIG. 7 depicts an exploded view of DIP switches showing an example of adding the hexadecimal address 2000H.
Figure 8:
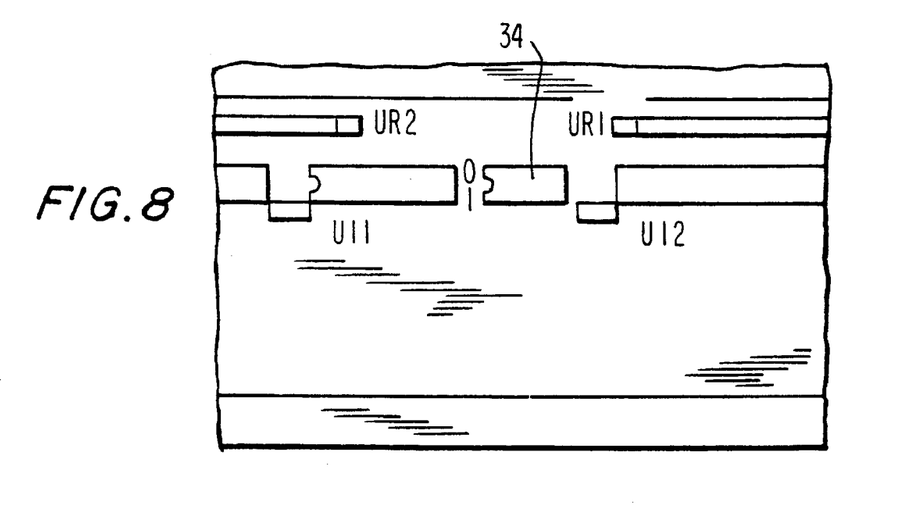
FIG. 8 depicts an exploded view of another section of a carrier card showing the offset switch location.

FIGS. 5 and 5A show the overall configuration of an embodiment of the carrier card 14 showing a first set of connectors 30, a second set of connectors 32, DIP switches 34, an inter-card bus 36, the connections 38 between the first set of connectors and the second set of connectors, DMA acknowledge jumpers 40 and memory select jumper 42. The connections 38 between the first set of connectors and the second set of connectors enable the top loading PC instrument card to be front loaded.

The first set of connectors 30 face and plug into the instrument receiving slots 24. The connectors on the ordinary PC instrument card 12 face and plug into the second set of connectors 32. The carrier card 14 slides into the computer instrument chassis, connecting to one of the 14 instrument receiving slots 24 on the mother board. The carrier card has two PCB ground layers which offer shielding and isolation for the PC instrument cards. Rear and top card guides are used to hold the instrument in place.

One feature of the present invention is extended I/O addressing. PC-based instruments occupy several I/O addresses (from 2 to 64 in most cases). Since the PC I/O space is limited, it is sometimes impossible to use more than three of four instruments even if there are slots 24 available. The carrier card 14 has the ability to perform additional addressing than is normally done with standard I/O cards. The carrier card 14 has an offset DIP switch 34 that can add an offset address to any standard card address. This offset is independent of the slot used to install the carrier card. For example if a GT64 switch card has a base address of 0x300, we can add 0x1000 to arrive at a new address.

| Card Base Address | 0x0300 (note extra leading zero for alignment) |
|---|---|
| Offset Address | 0x1000 |
| New Base Address | 0x1300 |

This enables an operator to install two or more cards all with the same base address setting, and by using the DIP Switches 34 locate the cards at different base memory addresses.

If the PC instrument card 24 being mounted on the carrier card 14 uses DMA, the DMA acknowledge jumpers 40 need to be added. The jumpers are used for DMA read operations, where the PC bus direction needs to be reversed. The selection made here should match the requirements of the PC instrument card. For example, in FIG. 6, the DMA acknowledge jumpers 40 are clearly shown. If the instrument uses DMA #1 and DMA #5, jumper DACK1 in group A and jumper DACK5 in group B or jumper DACK1 in group B and DACK5 in group A.

If the PC instrument card 12 being used is memory mapped (i.e. uses CPU memory below 1 Meg.) then a memory select jumper 42 should be put in place. The following table indicates the jumper requirements for the desired memory area:

| Jumper | Memory |
|---|---|
| MEMS2 | D0000 - D7FFF |
| MEMS3 | D8000 - DFFFF |
| MEMS4 | E0000 - E7FFF |
| MEMS5 | E8000 - EFFFF |

Figure 9:
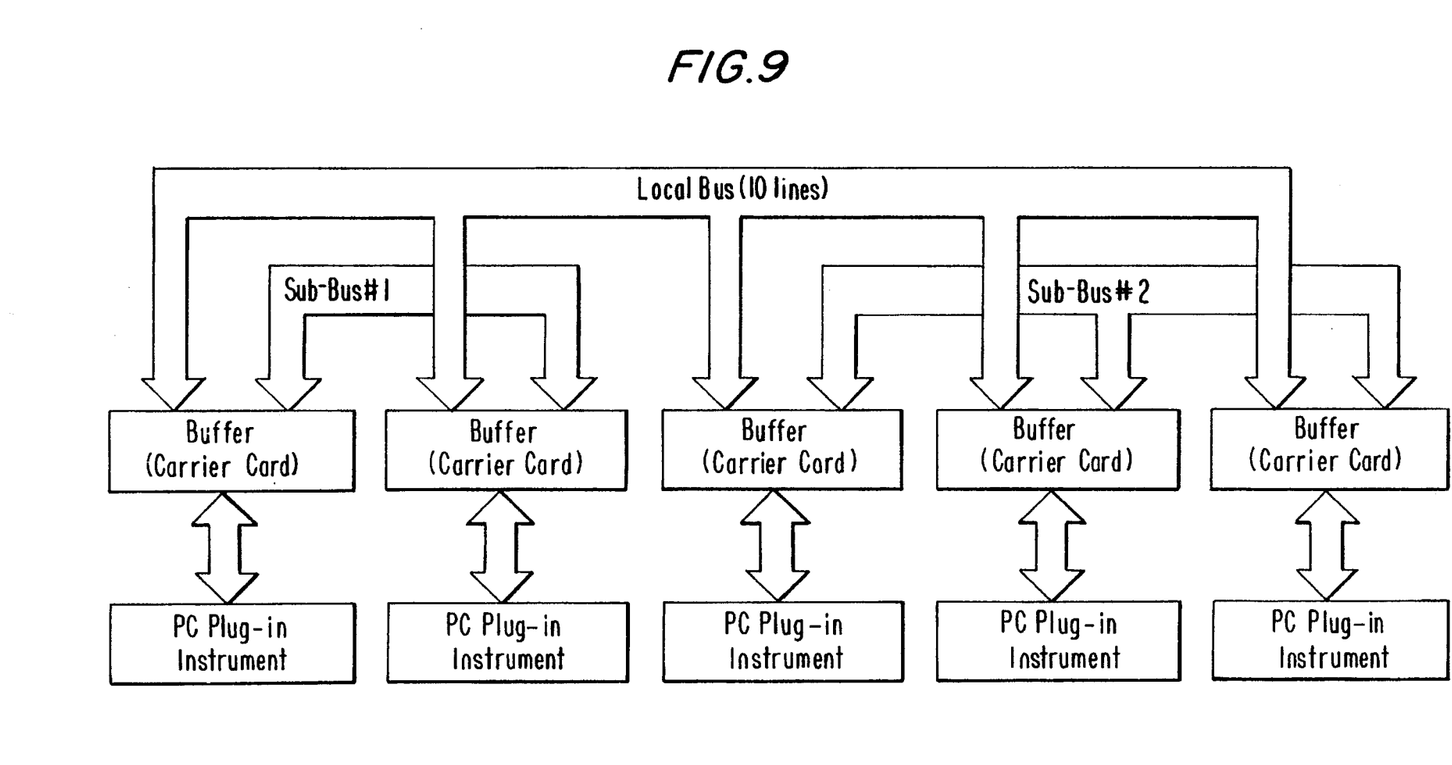
FIG. 9 depicts a flow chart showing an inter-card bus and sub busses between the carrier cards.

Some applications require interconnections between the instruments. In accordance with the present invention the carrier card 14 includes an internal twenty four line intercard bus 36 for intercard signal transfers. Twelve of the lines may be configured into several sub-busses serving selected carrier cards 14 only. This capability is illustrated in FIG. 9.

It will thus be seen that the invention efficiently attains the objects set forth above, among those made apparent from the preceding description. In particular, the invention provides a computer instrument chassis. The chassis can be utilized as a stand-alone computer or it can operate as a bus extender for an existing computer. Those skilled in the art will appreciate that the configurations depicted in FIGS. 1–5 and 11 and are distinguishable over the art in that they allow top loading pc instrument cards to be front loaded, the invention has dual capabilities, it has an improved cooling system, an improved power system and the system is completely buffered which enabled insertion and removal of PC instrument cards without disrupting the CPU.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A front loading computer/bus extender comprising:

a housing having a front, the front having an opening in a first loading plane;

a plurality of instrument receiving slots located in said housing, each of said slots being engageable to a PC instrument card inserted through said front opening;

a carrier card for engaging said PC instrument card to said instrument receiving slot, first and second power supplies, said first power supply being electrically coupled to a first set of said plurality of instrument receiving slots, and a second power supply being electrically coupled to a second set of said plurality of instrument receiving slots, whereby a first set of said PC instrument cards are maintaining electrical and mechanical separation and isolation from a second set of said PC instrument cards.

2. An instrument chassis according to claim 1 wherein said carrier card comprises:

a board having a front, a first face, and a bottom;

a first set of connectors attached to said front whereby said carrier card connects to an instrument receiving slot in said instrument chassis at said front of said board;

a second set of connectors attached to said first face proximal said bottom such that a top loading PC instrument card is connectable to said carrier card in a relatively parallel position, said second set of connectors being coupled to said first set of connectors configured such that when said top loading PC instrument card is connected to said carrier card said top loading PC instrument card is capable of interacting with said front loading chassis, DIP switches coupled to said carrier card whereby an offset input/output address are added to a preexisting address of the PC instrument card; and, an inter-card bus attached to said carrier card comprising a plurality of bus lines whereby selected bus lines are configured into several sub-buses serving selected cards.

3. An instrument chassis according to claim 2 wherein said carrier card further comprises a plurality of PCB ground layers which offer shielding and isolation for the PC instrument cards.

4. An instrument chassis according to claim 1 further including a CPU module having RS-232 ports and a parallel port, the CPU unit comprising a central processing unit, a floppy disk drive coupled to the central processing unit, a hard disk drive coupled to the central processing unit, and a VGA interface coupled to the central processing unit.

5. An instrument chassis according to claim 4 wherein the CPU module further includes an unused instrument receiving slot.

6. An instrument chassis according to claim 1 wherein said first power supply includes a first switch for selectively turning the power supply on and off;

said second power supply includes a second switch for selectively turning the power supply on and off; and the instrument chassis further comprises a plurality of cooling fans.

* * * * *